US012696383B2

(12) United States Patent
Yoshida et al.

(10) Patent No.: US 12,696,383 B2
(45) Date of Patent: Jul. 28, 2026

(54) FLEXIBLE WIRING BOARD, MANUFACTURING METHOD, ELECTRONIC MODULE, ELECTRONIC UNIT, AND ELECTRONIC APPARATUS

(71) Applicant: CANON KABUSHIKI KAISHA, Tokyo (JP)

(72) Inventors: Toshiyuki Yoshida, Kanagawa (JP); Yu Ogawa, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 377 days.

(21) Appl. No.: 18/490,597

(22) Filed: Oct. 19, 2023

(65) Prior Publication Data

US 2024/0138057 A1    Apr. 25, 2024
US 2024/0237196 A9    Jul. 11, 2024

(30) Foreign Application Priority Data

Oct. 24, 2022    (JP) ................................. 2022-169813

(51) Int. Cl.
| | |
|---|---|
| *H05K 1/02* | (2006.01) |
| *H04N 23/54* | (2023.01) |
| *H05K 1/14* | (2006.01) |
| *H05K 3/12* | (2006.01) |
| *H03H 1/00* | (2006.01) |

(52) U.S. Cl.
CPC ............. *H05K 1/028* (2013.01); *H04N 23/54* (2023.01); *H05K 1/0225* (2013.01); *H05K 1/147* (2013.01); *H05K 3/1216* (2013.01); *H03H 2001/0085* (2013.01); *H05K 2201/10151* (2013.01)

(58) Field of Classification Search
CPC .... H05K 1/028; H05K 1/0225; H05K 1/0224; H03H 2001/0085
USPC .......................................... 333/185; 174/254
See application file for complete search history.

(56) References Cited

U.S. PATENT DOCUMENTS

| | | | | |
|---|---|---|---|---|
| 5,195,238 A | * | 3/1993 | Kawakami | ........... H05K 1/0224 |
| | | | | 29/846 |
| 2008/0057299 A1 | * | 3/2008 | Adachi | ................ H05K 1/0346 |
| | | | | 428/458 |

(Continued)

FOREIGN PATENT DOCUMENTS

| | | |
|---|---|---|
| JP | 2012227211 A | 11/2012 |
| JP | 2016021457 A | 2/2016 |
| JP | 2021093507 A | 6/2021 |

*Primary Examiner* — Rakesh B Patel
(74) *Attorney, Agent, or Firm* — Canon U.S.A., Inc. IP Division

(57) ABSTRACT

A flexible wiring board includes a signal line that transmits a signal and an electroconductive layer that is disposed to face the signal line, wherein the electroconductive layer includes a first portion in which a plurality of openings are provided, and a linear second portion that is formed in at least one of the plurality of openings, that has, at one end thereof, a connection portion connected to the first portion, and whose other end is an open end, where the connection portion is disposed in the second portion on a sending side in a transmission direction of a signal through the signal line. An angle between a direction along the transmission direction of the signal and an extension direction of the second portion from the connection portion toward the open end is an acute angle or an obtuse angle.

20 Claims, 4 Drawing Sheets

(56) References Cited

U.S. PATENT DOCUMENTS

2012/0206218  A1      8/2012  Takahashi
2013/0313013  A1*   11/2013  Porta .................... H05K 1/0225
                                                                174/268

* cited by examiner

FLEXIBLE WIRING BOARD, MANUFACTURING METHOD, ELECTRONIC MODULE, ELECTRONIC UNIT, AND ELECTRONIC APPARATUS

BACKGROUND

Field of the Disclosure

The present disclosure relates to a flexible wiring board, a manufacturing method, an electronic module, an electronic unit, and an electronic apparatus.

Description of the Related Art

A flexible wiring board is used as a signal transmission path in electronic apparatuses, such as a mobile phone, a smartphone, a tablet terminal, and a digital camera. In addition to a signal line, an electroconductive portion is provided in the flexible wiring board in order to improve electrical and/or mechanical function.

For example, Japanese Patent Laid-Open No. 2021-93507 discloses a wiring substrate including a ground layer that faces a differential signal line and that has an opening portion having a plurality of openings that are continuously arranged along a predetermined direction.

With this configuration, the wiring substrate disclosed in Japanese Patent Laid-Open No. 2021-93507 reduces radiation noise.

As the functionality of electronic apparatuses has improved in recent years, further increase in communication speed is required to enable high-capacity data communication. However, when communication speed is increased, a larger amount of electromagnetic noise may be generated from signal wiring.

SUMMARY

The present disclosure provides a flexible wiring board that can further suppress radiation noise generated due to high-speed communication.

A flexible wiring board includes a signal line that transmits a signal and an electroconductive layer that is disposed to face the signal line. The electroconductive layer includes a first portion in which a plurality of openings are provided, and a linear second portion that is formed in at least one of the plurality of openings, that has, at one end thereof, a connection portion connected to the first portion, and whose other end is an open end. The connection portion is disposed in the second portion on a sending side in a transmission direction of a signal through the signal line. An angle between a direction along the transmission direction of the signal and an extension direction of the second portion from the connection portion toward the open end is an acute angle or an obtuse angle.

Further features of the present disclosure will become apparent from the following description of exemplary embodiments with reference to the attached drawings.

DESCRIPTION OF THE EMBODIMENTS

Hereafter, embodiments of the present disclosure will be described with reference to the drawings. The embodiments described below are each one embodiment of the disclosure, and the disclosure is not limited to these. Elements common to the embodiments will be described with cross-reference to a plurality of drawings, and descriptions of elements that are denoted by the same numerals will be omitted as appropriate. Different items having the same name can be discriminated from each other by referring to the items with ordinal numbers like "a first item", "a second item", and so on.

First Embodiment

Figure 1A:
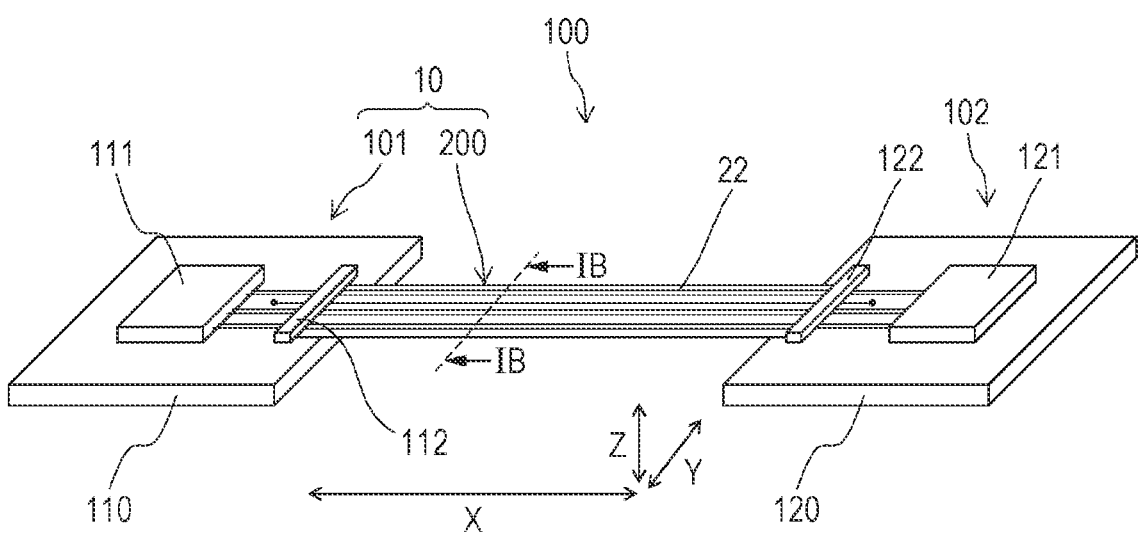
FIG. 1A is a top view of an electronic unit including a wiring board according to one or more embodiment of the subject disclosure.
Figure 1B:
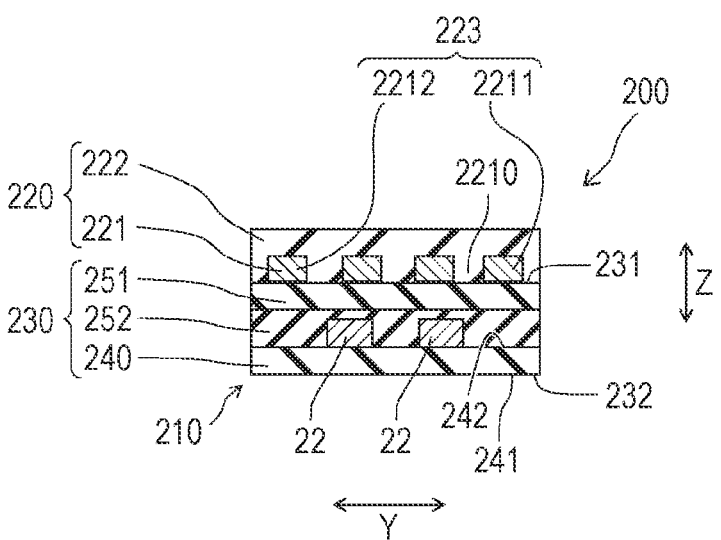
FIG. 1B is a sectional view taken along line IB-IB in FIG. 1A.

Referring to FIGS. 1A and 1B, the configuration of a wiring board 200 according to the present embodiment will be described. FIG. 1A is a perspective view of an electronic unit 100 including the wiring board 200. The wiring board 200 is, for example, a flexible printed wiring board. A method of forming wiring in the wiring board 200 is not limited to printing. The wiring may be pre-formed wires, and the wiring board 200 may be a flat cable.

The electronic unit 100 includes a circuit board 101, a circuit board 102, and the wiring board 200 that electrically connects the circuit board 101 and the circuit board 102. The circuit board 101 and the circuit board 102 are, for example, printed circuit boards. An article in which the wiring board 200 and at least one of the circuit board 101 and the circuit board 102 are connected to each other can be called an electronic module 10. For example, it is possible to configure the electronic unit 100 by preparing the electronic module 10 in which the wiring board 200 is connected to the circuit board 101 and by connecting the wiring board 200 of the electronic module 10 further to the circuit board 102. Moreover, it is possible to configure an electronic apparatus including the electronic unit 100 by mounting various devices on the circuit board 102.

As illustrated in FIG. 1A, the wiring board 200 extends in the X direction, which is the longitudinal direction. The wiring board 200 includes a plurality of signal lines 22, each of which extends in the X direction. The plurality of signal lines 22 are arranged at intervals in the Y direction that is a transversal direction perpendicular to the X direction. The Z direction, which is perpendicular to the X direction and the Y direction, is the thickness direction of the wiring board 200. The wiring board 200 has flexibility and can be deformed to be bent.

In the present embodiment, all portions of the plurality of signal lines 22 are arranged side by side in the Y direction as seen from the Z direction (in plan view). However, it is sufficient that at least some portions of the signal lines 22 be arranged side by side in the Y direction.

A connector 112 is mounted on a wiring board 110 that constitutes the circuit board 101. The connector 112 is electrically connected to a semiconductor device 111 through a conductor pattern on the wiring board 110. As with the wiring board 110, a connector 122 is mounted on a wiring board 120 that constitutes the circuit board 102. The connector 122 is electrically connected to a semiconductor device 121 through a conductor pattern on the wiring board 120.

Each of the wiring board 110 and the wiring board 120 is, for example, a rigid wiring board, and it is possible to use a printed wiring board (rigid printed wiring board) including a resin substrate or a ceramic substrate as each of the wiring boards 110 and 120.

With the configuration described above, the semiconductor device 111 and the semiconductor device 121 are electrically connected to be communicable with each other via the wiring board 110, the wiring board 200, and the wiring board 120. At this time, the wiring board 200 may be connected, not via the connectors 112 and 122, but directly to the wiring boards 110 and 120 with solder.

FIG. 1B is a sectional view taken along line IB-IB of FIG. 1A.

A wiring board body 210 includes an insulator portion 230 and the plurality of signal lines 22. The insulator portion 230 is made of a material having electrically insulating properties. Each signal line 22 is made of a material having electroconductivity. The wiring board body 210, that is, the insulator portion 230 and the plurality of signal lines 22, are formed to extend in the X direction. The plurality of signal lines 22 are disposed inside of the insulator portion 230 at intervals in the Y direction. However, it is not necessary that the plurality of signal lines 22 be disposed inside of the insulator portion 230. Although two of the plurality of signal lines 22 are illustrated in FIG. 1B, the number of signal lines in the present embodiment is not limited to two, and may be three or more. The insulator portion 230 has a sheet-like shape, and has a pair of main surfaces 231 and 232 extending in the X direction. A shield member 220 is disposed at a position in contact with either one of the pair of main surfaces 231 and 232. In the present embodiment, the shield member 220 is disposed at a position in contact with the main surface 231. The shield member 220 may be disposed on each of the pair of main surfaces 231 and 232.

The insulator portion 230 includes a plurality of insulating layers 240, 251, and 252. The plurality of insulating layers 240, 251, and 252 are in contact with each other. The insulating layer 240 is an insulating substrate, and has a pair of main surfaces 241 and 242. The plurality of signal lines 22 are disposed on the main surface 242. The insulating layer 251 is disposed at a position above the main surface 242 and above the plurality of signal lines 22.

In the present embodiment, the insulator portion 230 includes the insulating layer 252 disposed between the insulating layer 240 and the insulating layer 251. The insulating layer 252 has a function of bonding the insulating layer 240 and the insulating layer 251. If the insulating layer 251 has the bonding function, the insulating layer 252 may be omitted.

Hereafter, each signal line 22 will be described in detail. Each signal line 22 is wiring that can be used to transmit a digital data signal. As the signal transmission amount has increased, it is desirable to configure a differential signal line in which a pair of the plurality of signal lines 22 forms one set. The transmission direction in each signal line 22 is basically the same direction for all signal lines 22. However, there may be provided a signal line that performs transmission in a different direction. The plurality of signal lines 22 may include wiring that transmits a single-end signal such as a control signal or a response signal. The wiring board 200 may include a ground line (not shown) in addition to the signal lines 22.

A method of forming the signal lines 22 is not particularly limited. For example, it is possible to form the signal lines 22 by using a method such as affixing of metal foil, metal plating, an inkjet process, or the like. In a case where copper foil is used as the metal foil, it is possible to form a necessary transmission line pattern by performing a photolithography-and-etching process by using a film to which the copper foil has been affixed with an adhesive. In a case where an inkjet process is used, it is possible to form a necessary pattern by printing the pattern with a polymer ink including metal particles and by firing the pattern at a temperature lower than or equal to the glass-transition point (Tg) of the insulating layer 240.

Although the thickness of the signal line 22 is not particularly limited, the thickness may be, for example, 0.1 μm or greater and 20 μm or less.

Hereafter, the shield member 220 will be described in detail. The shield member 220 is a sheet-shaped member, and includes: an electroconductive layer 221 including an electroconductive portion 223; and an insulating layer 222 inside of which the electroconductive portion 223 is provided. The electroconductive portion 223 is disposed at a position in contact with the main surface 231 of the insulator portion 230. It is sufficient that the electroconductive portion 223 be disposed at least at a position facing the signal lines 22 or at a position overlapping the signal lines 22 in plan view. The electroconductive portion 223 has electroconductivity, and may be a shield layer that blocks electromagnetic noise. The insulating layer 222 is a protective layer that surrounds the electroconductive portion 223 so that the electroconductive portion 223 may not contact a member around the wiring board 200, and is composed of a member having electrically insulating properties.

Each electroconductive portion 223 includes lines 2211 and lines 2212 in which a plurality of openings 2210 are provided. Here, the electroconductive layer 221 is a shield layer including the electroconductive portion 223 and the openings 2210.

Although the electroconductive layer 221 need not be electrically connected to any member, in the present embodiment, the electroconductive layer 221 is used as a path of a return electric current of a signal that passes through the signal line 22, and is a part of a ground line. That is, the electroconductive layer 221 is electrically connected to the ground lines of the wiring boards 110 and 120.

Because the wiring board 200 has the electroconductive layer 221, it is possible to reliably obtain a shielding effect against electromagnetic noise emitted from the wiring board 200 and electromagnetic noise transmitted from the outside to the wiring board 200. The insulating layer 222 is provided on the electroconductive layer 221.

For example, the electroconductive layer 221 can have a shielding function when a fixed electric potential is supplied to the electroconductive layer 221. The electroconductive layer 221 having a shielding function can be called a shield layer. The fixed potential to be supplied to the shield layer is, for example, a power source potential or a ground potential. However, the fixed potential is not limited to this. An electroconductive layer to which a ground potential is supplied can be called a ground layer.

Figure 2A:
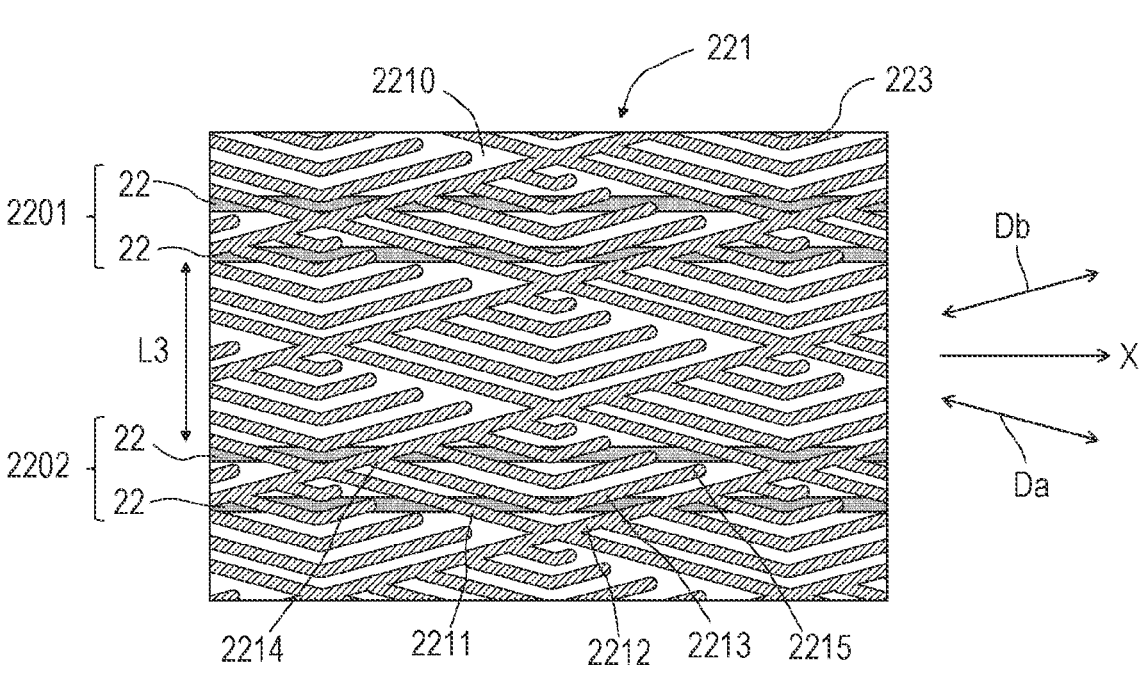
FIG. 2A is a top view of a wiring board according to a first embodiment.

FIG. 2A is a plan view of the wiring board 200 according to the present embodiment. For convenience, only the signal lines 22 and the electroconductive layer 221 are illustrated in FIG. 2A.

As illustrated in FIG. 2A, the electroconductive layer 221 includes: a plurality of lines (linear electroconductive portions) 2211 extending in a Da direction that intersects the X direction that is the extension direction of the signal lines 22; and a plurality of lines (linear electroconductive portions) 2212 extending in a Db direction that intersects the Da direction. That is, the present embodiment has a configuration such that a part of the electroconductive layer 221 has a grid shape and the openings 2210, each having a rhombic shape, are formed between the grid. The electroconductive layer 221 includes a line (linear electroconductive portion) 2213 that has, at one end thereof, a connection portion 2214 connected to the line 2211, that extends from the connection portion 2214 into the opening 2210, and whose other end has a terminal end portion 2215 as an open end. The lines 2211 and the lines 2212 are, for example, a first portion of the electroconductive layer 221; and the line 2213 is, for example, a second portion of the electroconductive layer 221.

In the wiring board 200 according to the present embodiment, the line 2213 having the terminal end portion 2215 extends from at least one of the line 2211 and the line 2212. Moreover, the connection portion 2214 is disposed on the sending side in the transmission direction of a signal that flows through the signal line 22. The term "transmission direction" refers to a direction in which a signal current flows from the sending side to the receiving side. Thus, it is possible to sufficiently block electromagnetic noise, because a cancelling current in an opposite phase to the transmission direction, which is generated by electromagnetic coupling between the signal line 22 and the electroconductive layer 221, swiftly flows toward the line 2211 or the line 2212. Here, the transmission direction coincides with the direction in which the signal line 22 extends (the extension direction). When one wiring board 200 has a plurality of transmission directions, the disposition of the connection portion 2214 may be changed in accordance with the place.

The length L of the line 2213 may be set so that $L=\lambda/4$, where $\lambda$ is the resonant wavelength of electromagnetic noise to be blocked. For example, when the dielectric constant of the insulating layer 222 is 3.2, at 5 GHz, the length from the connection portion 2214 to the terminal end portion 2215 may be set to about 8.4 mm, and, at 10 GHz, the length from the connection portion 2214 to the terminal end portion 2215 may be set to about 4.2 mm.

In the present embodiment, the line 2213 has a bent line shape. That is, the line 2213 has a shape such that a portion extending in the Da direction and a portion extending in the Db direction are connected. Here, the length of the line 2213 is defined as the sum of the length of the portion extending in the Da direction and the length of the portion extending in the Db direction.

In the present embodiment, a plurality of lines 2213 are provided in one opening 2210, and the lengths L of the lines 2213 differ from each other. With such a configuration, it is possible to produce an effect of blocking electromagnetic radiation over a plurality of frequency ranges and to reduce electromagnetic noise that affects wireless communication. In a case where the plurality of lines 2213 are provided, the distance between a line 2213 and another line 2213 adjacent to the line 2213 may be 20 μm or greater. In particular, the distance between a line 2213 and another line 2213 adjacent to the line 2213 may be greater than the line width W3 of the line 2213. With the configuration described above, particularly in a flexible wiring board, it is possible to suppress electromagnetic noise in a high-frequency band, which tends to be generated when communication speed is increased. Regarding the lengths of the lines 2213, a line 2213 having a medium length may be disposed between a long line 2213 and a short line 2213. Moreover, the lines 2213 may be arranged in order of length, the second shortest one may be formed adjacent to the shortest one, and the third shortest one may be formed adjacent to the second shortest one.

The line width W3 of the line 2213 may be greater than at least one of the line width W1 of the line 2211 and the line width W2 of the line 2212. If the line width W3 of the line 2213 is small, the resistance of the line 2213 increases and it becomes difficult for the line 2213 to serve as a return path, and the noise suppression effect may decrease.

Although the line widths W1 and W2 of the line 2211 and the line 2212 are not particularly limited, the line widths W1 and W2 may be 50 μm or greater and 200 μm or less. When the line widths W1 and W2 of the line 2211 and the line 2212 are 50 μm or greater, the electromagnetic noise suppression effect in higher frequency bands is produced, and it is possible to suppress malfunctioning of a semiconductor device in the surrounding area. Therefore, it is possible to suppress variation in impedance between the signal lines 22, and thus it is possible to reduce transmission error of a digital signal that is transmitted.

Figure 2B:
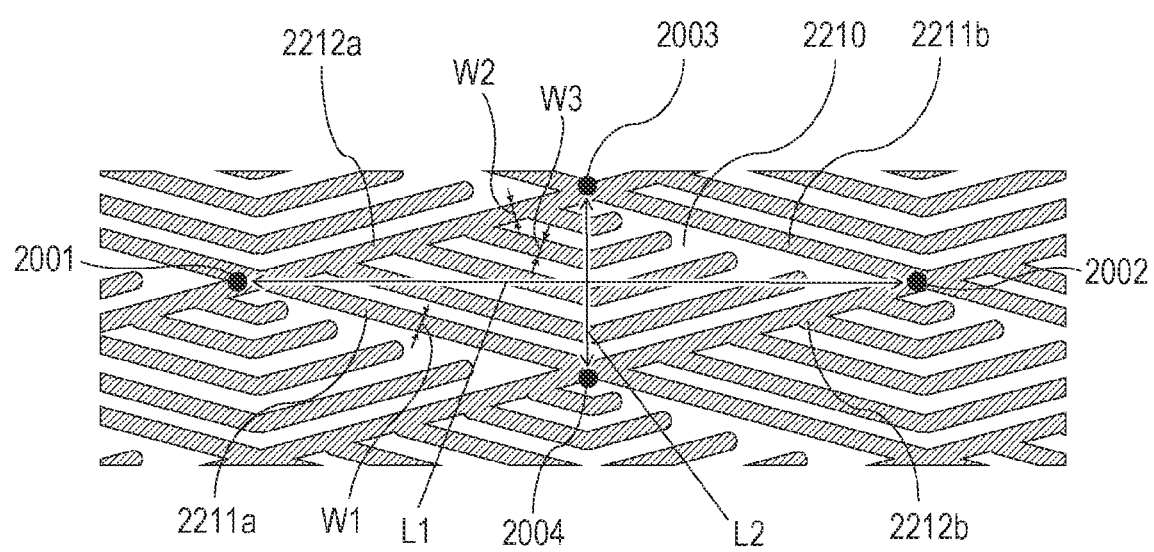
FIG. 2B is a partial enlarged view of FIG. 1A.

FIG. 2B is a partial enlarged view of FIG. 2A from which the signal lines 22 are omitted. As illustrated in FIG. 2B, in each opening 2210, a center point 2001, where a line 2211a and a line 2212a intersect, is present. Moreover, a center point 2002, where a line 2211b and a line 2212b intersect, is present opposite the center point 2001 with the opening 2210 therebetween. A first line segment L1 that connects the center point 2001 and the center point 2002 is defined. Likewise, a second line segment L2 that connects a center point 2003, where the line 2211b and the line 2212a intersect, and a center point 2004, which is present opposite to the center point 2003 with the opening 2210 therebetween and where the line 2211a and the lines 2212b intersect, is defined.

The second line segment L2 is a line segment that intersects the first line segment L1 and that is shorter than the first line segment L1, and the length of the first line segment L1 may be 1.5 times or greater of the length of the second line segment L2. The length of the first line segment L1 may be 1 mm or greater and 7 mm or less. When the length of the first line segment L1 is 1 mm or greater and 7 mm or less, the effect of blocking electromagnetic noise emitted from the signal lines 22, that is, from the wiring board 200 is high. Thus, it is possible to effectively reduce electromagnetic noise that affects wireless communication. In view of the above, the length of the first line segment L1 may be 1 mm or greater and 7 mm or less. The acute angle between the first line segment L1 and the signal line 22 is preferably 45 degrees or less, and more preferably 30 degrees or less.

The opening ratio of the electroconductive layer 221 may be 40% or greater and 95% or less. The opening ratio of the electroconductive layer 221 is defined as the ratio of the area of the openings 2210 per unit area when the electroconductive layer 221 is seen in plan view. A part of the electroconductive layer 221 and some of the plurality of openings 2210 are included in a unit area. When the opening ratio of the electroconductive layer 221 is 40% or greater, it is possible to make the opening amplitude value of an eye pattern in signal transmission sufficiently large, and it is possible to reduce transmission error of a digital signal transmitted through the signal line 22. When the opening ratio of the electroconductive layer 221 is 95% or less, it is possible to sufficiently block electromagnetic noise. Thus, it is possible to effectively reduce electromagnetic noise emitted from the signal lines 22, that is, the wiring board 200. That is, it is possible to effectively reduce electromagnetic noise that affects wireless communication. In view of the above, the opening ratio of the electroconductive layer 221 may be 50% or greater and 90% or less.

When two signal lines 22 are one set of differential signal lines as illustrated in FIG. 2A, the length of the second line segment L2 of each opening 2210 may be less than the distance L3 between a differential signal line 2201 and a differential signal line 2202 adjacent to the differential signal line 2201. Here, the distance between the differential signal line 2201 and the differential signal line 2202 is defined as the distance between a differential signal line that is included in the differential signal line 2201 and that is on the differential signal line 2202 side and a differential signal line that is included in the differential signal line 2202 and that is on the differential signal line 2201 side. Thus, it is possible to suppress generation of cross-talk noise between two sets of differential signal lines, and it is possible to suppress occurrence of an error in signal transmission.

Figure 3:
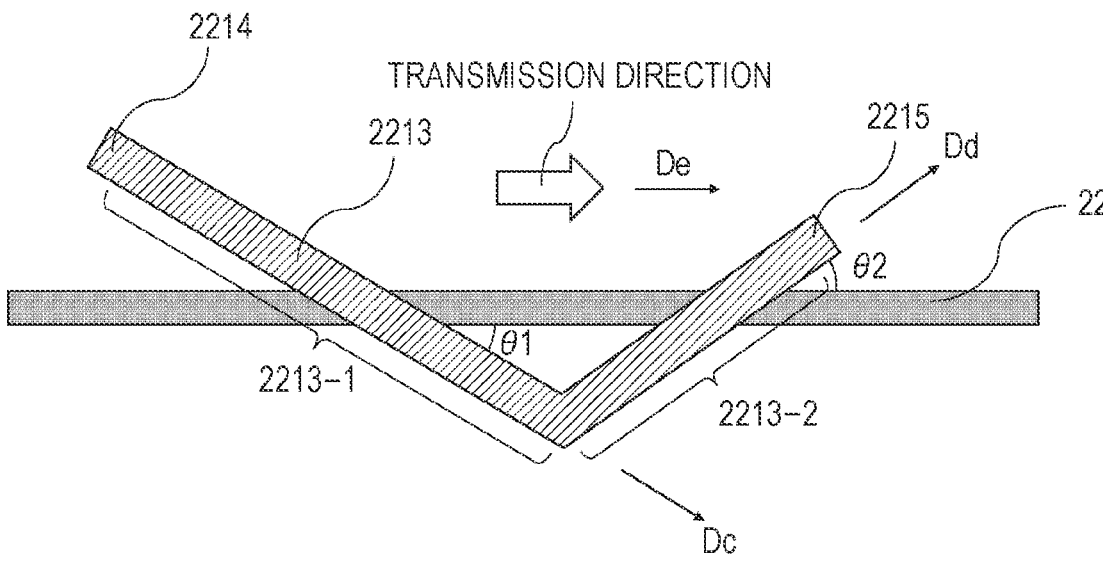
FIG. 3 is a partial enlarged view of the wiring board according to the first embodiment.

FIG. 3 is an enlarged view illustrating only the line 2213 and the signal line 22 of FIG. 2A. A signal is being transmitted through the signal line 22 in the transmission direction shown in FIG. 3. At this time, the angle between an extension direction of the line 2213 from the connection portion 2214 toward the terminal end portion 2215 and an extension direction of the signal line 22 along the transmission direction of the signal is an acute angle or an obtuse angle. That is, the angle between the extension direction of the signal line 22 and the extension direction of the line 2213 is an angle that is not 0° nor 90°. In other words, the extension direction of the line 2213 is not parallel to the extension direction of the signal line 22 and intersects the extension direction of the signal line 22 at an angle that is not a right angle. If the line 2213 were perpendicular to the transmission direction or completely overlaps the transmission direction, it would not possible to effectively suppress electromagnetic noise. The phrase "an extension direction of the line 2213 from the connection portion 2214 toward the terminal end portion 2215" refers to, not the direction directly from the connection portion 2214 toward the terminal end portion 2215, but the direction along the extension direction of the line 2213 from the connection portion 2214 toward the terminal end portion 2215.

For example, in the present embodiment, the line 2213 has a bent line shape illustrated in FIG. 3, that is, a shape in which a line 2213-1 and a line 2213-2, which extend in directions different from each other, are connected.

On the other hand, a De direction is defined as an extension direction of the signal line 22 along the transmission direction illustrated in FIG. 3.

Here, the angle θ1 between an extension direction of the line 2213-1 from the connection portion 2214 toward the terminal end portion (open end) 2215 (Dc direction) and the De direction is an acute angle. The angle θ2 between the extension direction of the line 2213-2 from the connection portion 2214 toward the terminal end portion (open end) 2215 (Dd direction) and the De direction is also an acute angle. Although the angles between the directions are all acute angles in the present embodiment, in an embodiment illustrated in FIG. 4 described below, there is a portion where the angle between the extension direction of the line

2213 from the connection portion 2214 toward the terminal end portion 2215 and the extension direction of the signal line 22 along the transmission direction of a signal is an obtuse angle.

Although the noise suppression effect can be obtained when the angle θ (θ1 or θ2) between the aforementioned directions is an acute angle or an obtuse angle, particularly, the angle θ may be an acute angle. When the angle θ is an acute angle, it is possible to sufficiently block electromagnetic noise, because a cancelling current in an opposite phase to the transmission direction, which is generated by electromagnetic coupling between the signal line 22 and the electroconductive layer 221, swiftly flows toward the line 2211 or the line 2212.

A method of forming the electroconductive layer 221 is not particularly limited. Examples of the method of forming the electroconductive layer 221 on the main surface 231 of the insulator portion 230 illustrated in FIG. 1B include: a subtractive method, an electroless-plating method, an electroplating method, and a physical vapor deposition method such as a vacuum deposition method or a sputtering method. Known coating methods such as bar coating, slit coating, and screen printing can be used. Among these methods, as a method of forming the patterned electroconductive layer 221 on the main surface 231 of the insulator portion 230, screen printing, which can apply a pattern coating of an electroconductive material under normal temperature and normal pressure, may be used. The electroconductive material formed by screen printing is heated to form a dry coating, and thus the electroconductive layer is produced.

Examples of the material of the electroconductive layer 221 include: a metal material such as gold, silver, copper, aluminum, or nickel; an electroconductive resin in which electroconductive filler such as metal particles, metal fiber, or carbon nanotube is mixed in a resin; and an electroconductive polymer such as polythiophene or polypyrrole. Among these, as a material for forming a coating, a silver paste that is composed of silver particles, having particularly high electroconductivity, and a resin binder is suitable. Besides a silver paste, a gold paste, a copper paste, a carbon paste or the like may be used.

In a case where a silver paste is used to form the electroconductive layer 221, the viscosity of the silver paste may be 1 Pa·s or greater and 500 Pa·s or less, when the shear velocity is 10/s. When the viscosity of the silver paste is 1 Pa·s or greater, the line width of the electroconductive layer 221 does not change after having been formed, and it is possible to obtain the electroconductive layer 221 having stable quality. When the viscosity of the silver paste is 500 Pa·s or less, it is possible to form a line of the electroconductive layer 221 while preventing the line from being broken. In view of the above, the viscosity of the silver paste may be in the range of 5 to 100 Pa·s, when the shear velocity is 10/s.

In view of electromagnetic-noise blocking ability, the electric resistivity of the electroconductive layer 221 is preferably $1 \times 10$ Ω·cm or less, and more preferably $1 \times 10^{-5}$ Ω·cm or less.

The thickness of the electroconductive layer 221 in the Z direction may be in the range of 1 μm or greater and 20 μm or less. When the thickness is 1 μm or greater, it is possible to make the electric resistivity of the electroconductive layer 221 sufficiently large. Therefore, it is possible to make the opening amplitude value of an eye pattern in signal transmission sufficiently large, and it is possible to reduce transmission error of a digital signal transmitted through the signal line 22. When the thickness is 20 μm or less, it is also possible to reduce the thickness of the insulating layer 222 illustrated in FIG. 1B, and thus it is possible to provide a wiring substrate having higher flexibility. In view of the above, the thickness of the electroconductive layer 221 in the Z direction may be 2 μm or greater and 15 μm or less.

Hereafter, the insulating layer 240, the insulating layer 251, the insulating layer 252, and the insulating layer 222 illustrated in FIG. 1B will be described in detail.

First, the insulating layer 240 will be described in detail. The material of the insulating layer 240, which is an insulating substrate, may be a resin. Examples of the resin include: a polyimide-based resin such as polyimide, polyamide, or polyamide-imide; a thermosetting resin such as epoxy; and a thermoplastic resin such as liquid-crystal polymer. Among these, the resin may be polyimide or a liquid-crystal polymer. Polyimide has high heat resistance and good mechanical characteristics, and is commercially available easily. Liquid crystal has a low relative dielectric constant and thus is suitable for transmitting high-speed signals, and has low hygroscopicity and high dimensional stability.

The thickness of the insulating layer 240 in the Z direction may be, for example, 10 μm or greater and 100 μm or less. When the thickness of the insulating layer 240 in the Z direction is 10 μm or greater, it is possible to separate the signal lines 22 from surrounding electronic components by a sufficient separation distance, and it is possible to suppress the characteristic impedance of the signal lines 22 from being changed. When the thickness of the insulating layer 240 in the Z direction is 100 μm or less, it is possible to reduce the rigidity of the insulating layer 240, and the wiring board 200 can have sufficient flexibility. In view of the above, the thickness of the insulating layer 240 in the Z direction may be 12 μm or greater and 75 μm or less.

Next, the insulating layer 251 will be described in detail. A plastic and/or an insulating resin can be used as the insulating layer 251. Examples of the plastic used for the insulating layer 251 include a so-called engineering plastic. That is, examples of the plastic used for the insulating layer 251 include: polypropylene, cross-linked polyethylene, polyester, polybenzimidazole, polyamide, polyimide, polyimide amide, and polyetherimide. Examples of the plastic used for the insulating layer 251 further include: polyphenylene sulfide (PPS), polyethylene naphthalate (PEN), and polyetheretherketone (PEEK). In view of low cost, a polyester film may be used. In view of flame resistance, a polyphenylene sulfide film may be used. When heat resistance is further required, an aramid film or a polyimide film may be used.

An insulating resin used for the insulating layer 251 may be any appropriate resin having electrical insulating properties, such as a thermosetting resin or a UV-curable resin. Examples of the thermosetting resin include: a phenol resin, an acrylic resin, an epoxy resin, a melamine resin, a silicone resin, and an acrylic modified silicone resin. Examples of the UV-curable resin include: an epoxy acrylate resin, a polyester acrylate resin, and a modified methacrylate of any of these. The resin may be cured in any appropriate way such as thermosetting, UV curing, or electron-beam curing. As necessary, a color pigment or another additive such as a fire retardant, an antioxidant, a lubricant, a dedusting inhibitor, or a curing accelerator may be added.

Although a method of forming the insulating layer 251 is not particularly limited, coating of a plastic with an insulating resin can be performed by using the following method. For example, a plastic can be coated with a solution, in which an insulating resin is dissolved is a solvent, by using a gravure coating method, a kiss coating method, a die coating method, a blade method, a roller coating method, a knife coating method, a spray coating method, a bar coating method, a spin coating method, or a dip coating method. The solvent may be appropriately selected in accordance with the type of a resin to be used. Examples of the solvent that can be used include: a ketone solvent such as acetone, methyl ethyl ketone, or cyclohexanone; and an alcohol solvent such as methanol, ethanol, propanol, ethylene glycol, glycerin, or propylene glycol monomethyl ether. Examples of the solvent that can be used further include: an acid such as acetic acid; an amide solvent such as formamide, dimethylacetamide, or N-methylpyrrolidone; a nitrile solvent such as acetonitrile or propyronitrile; and an ester solvent such as methyl acetate or ethyl acetate. Examples of the solvent that can be used further include a carbonate solvent such as dimethylcarbonate or diethylcarbonate. In the coating process, as necessary, a heating or drying step for vaporizing the solvent may be provided. Heating and drying can be performed by using a heating device and a drying device such as an infrared heater and a hot-air dryer, and the heating temperature and the drying temperature may be selected in any appropriate way.

The thickness of the insulating layer 251 in the Z direction may be 5 μm or greater and 50 μm or less. When the thickness of the insulating layer 251 in the Z direction is 5 μm or greater, the insulating layer 251 can have a sufficient strength. When the thickness of the insulating layer 251 in the Z direction is 50 μm or less, sliding ability and bending ability are improved. In view of the above, the thickness of the insulating layer 251 in the Z direction may be 10 μm or greater and 30 μm or less. The volume resistivity the insulating layer 251 is preferably $10^9$ Ω·cm or greater, and more preferably $10^{13}$ Ω·cm or greater.

Next, the insulating layer 252 will be described in detail. The insulating layer 252 is an adhesive layer provided between the insulating layer 251, and the insulating layer 240 and the signal line 22. That is, the insulating layer 252 is a hardened adhesive. The insulating layer 252 may have high electrical insulation ability. Examples of the adhesive used to form the insulating layer 252 include: acrylonitrile-butadiene rubber (NBR)-based adhesive, polyamide-based adhesive, polyester-based adhesive, acrylic-based adhesive, polyester-polyurethane-resin-based adhesive, and silicone-based adhesive.

The insulating layer 252 may be capable of sufficiently covering each signal line 22, which is a transmission line, and be smooth. Thus, the thickness of the insulating layer 252 in the Z direction may be 2 μm or greater and 50 μm or less. When the thickness of the insulating layer 252 is 2 μm or greater, the adhesive can sufficiently fill the gaps between the signal lines 22, and can more firmly bond the signal lines 22 to the insulating layer 252. When the thickness of the insulating layer 252 is 50 μm or less, it is possible to suppress bleeding of the adhesive sideways from the space between the insulating layers 240 and 251. In view of the above, the thickness of the insulating layer 252 in the Z direction may be 5 μm or greater and 30 μm or less.

A method of forming the insulating layer 252 is not particularly limited. Examples of the method include: a method of bonding sheet-shaped adhesives together and hardening the adhesives, and a method of applying a liquid adhesive by using a dispenser or a printing method and hardening the adhesive with heat or UV rays.

Next, the insulating layer 222 will be described in detail. An insulating resin used for the insulating layer 222 may be any appropriate resin having insulating properties. Examples of the insulating resin include: a thermosetting resin; a UV-curable resin; and a coating agent including a resin solution in which a cured-film component is dispersed in a solvent. Examples of thermosetting resin include: a phenol resin, an acrylic resin, an epoxy resin, a polyamide resin, a polyamide-imide resin, a polyimide resin, a melamine resin, a silicone resin, and an acrylic modified silicone resin. Examples of the UV-curable resin include: an epoxy acrylate resin, a polyester acrylate resin, and a modified methacrylate of any of these. Examples of the resin solution include a solution in which a polyester-urethane resin or a polyamide-imide resin is dissolved in an organic solvent. As necessary, a color pigment, a fire retardant, an antioxidant, a lubricant, a plasticizer, a viscosity modifier, a dedusting inhibitor, a curing accelerator, an inorganic filler such as silica or carbon black, an organic filler such as silicone particles or polyester particles, or another known additive may be added. Among these, a coating agent including a resin solution in which a cured-film component is dispersed in a solvent is preferable, because shrinkage of the coating agent due to a curing reaction is small and warping can be suppressed. A coating agent in which a polyamide-imide resin having flexibility and heat resistance is dissolved in a solvent is more preferable.

A known method can be selected as a method of forming the insulating layer 222. For example, it is possible to use a method of forming a cured film after forming a coating film of a liquid resin composition, such as bar coating, slit coating, spray coating, dot dispensing, and screen printing. Another example of a method that can be used is a method in which a known plastic film is coated with an adhesive component and the plastic film is affixed onto the electro-conductive layer 221 via the adhesive-component layer. As a method of forming a cured film after forming the coating film, any appropriate method suitable for a material, such as thermosetting, UV-curing, electronic-beam curing, drying by heating, vacuum heating, or the like may be selected.

In view of preventing the electroconductive layer 221 from contacting a member around the wiring board 200, the thickness of the insulating layer 222 may be greater than the thickness of the electroconductive layer 221 in the Z direction. The thickness of the insulating layer 222 from a main surface 231 of the electroconductive layer 221 in the Z direction may be in the range of 2 µm or greater and 10 µm or less. When the thickness is 2 µm or greater, it is possible to effectively prevent the electroconductive layer 221 from contacting a member around the wiring board 200. When the thickness of the insulating layer 222 from the main surface 231 of the electroconductive layer 221 in the Z direction is 10 µm or less, it is possible to increase the flexibility of the wiring board 200 more effectively. In view of the above, the thickness of the insulating layer 222 from the main surface 231 of the electroconductive layer 221 in the Z direction may be 3 µm or greater and 7 µm or less.

Second Embodiment

Figure 4:
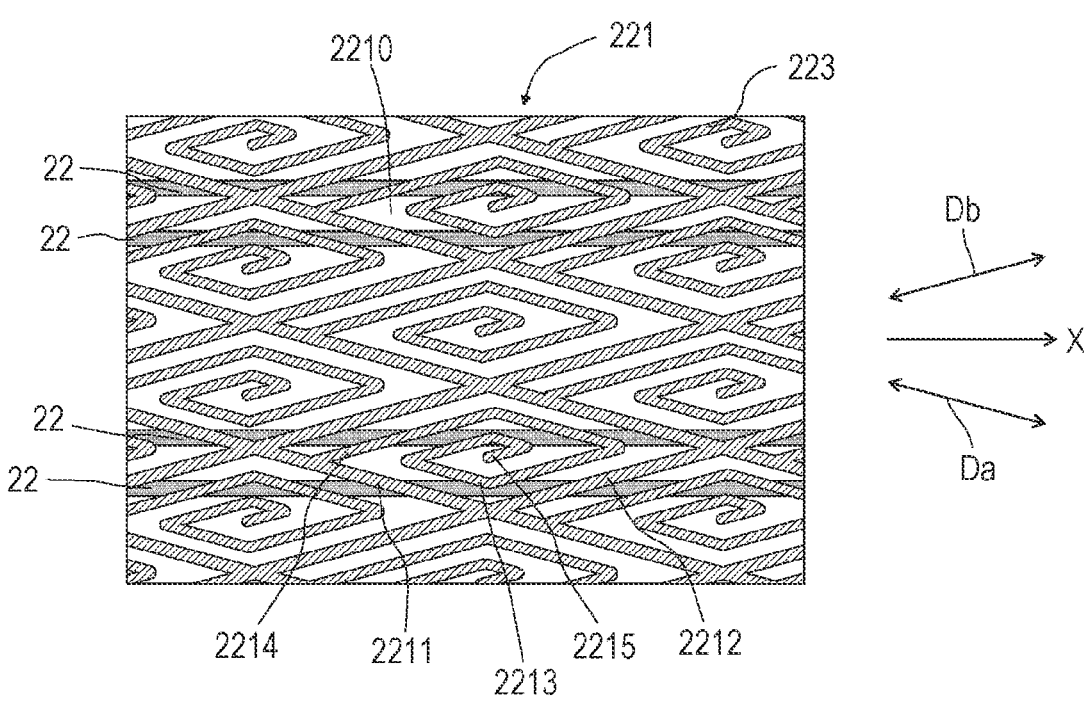
FIG. 4 is a top view of a wiring board according to a second embodiment.

Referring to FIG. 4, a wiring board 200 according to a second embodiment will be described. The wiring board 200 of the present embodiment differs from that of the first embodiment in that the line 2213 has a spiral shape in the opening 2210.

When the line 2213 has the spiral shape, the line 2213 has a portion that is bent in a direction opposite to the transmission direction. The angle between an extension direction of this portion from the connection portion 2214 toward the terminal end portion (open end) 2215 and an extension direction of the signal line 22 along the transmission direction of a signal is an obtuse angle.

Also when the line 2213 has a spiral shape, it is possible to suppress electromagnetic noise as in the first embodiment. Moreover, when the line 2213 has a spiral shape, compared with the first embodiment, it becomes easy to adjust the length of the line 2213, and it is possible to improve the functionality of the wiring board 200.

Although FIG. 4 illustrates a configuration such that the line 2213 having a spiral shape extends from one connection portion 2214, not only one line 2213 but a plurality of lines 2213 may be provided in one opening 2210. In this case, it is sufficient that at least one line 2213 have a spiral shape, and the other lines 2213 may have a bent line shape as in the first embodiment or a straight-line shape.

EXAMPLES

Next, Examples and Comparative Examples will be described. Note that the present disclosure is not limited by the Examples described below. Here, a wiring board in each Example will be referred to as a wiring board A, and a wiring board in each Comparative Example will be referred to as a wiring board B. The wiring board A in each Example corresponds to the wiring board 200 in the embodiments described above. Hereafter, the radiation noise suppressing effect of the wiring board A in each Example and the wiring board B in each Comparative Example will be evaluated.

In each of Examples and Comparative Examples, a single-sided flexible printed wiring board having a length of 150 mm in the X direction and a width of 20 mm in the Y direction and including twenty sets of differential signal lines was used.

Radiation Noise Measurement

Figure 5:
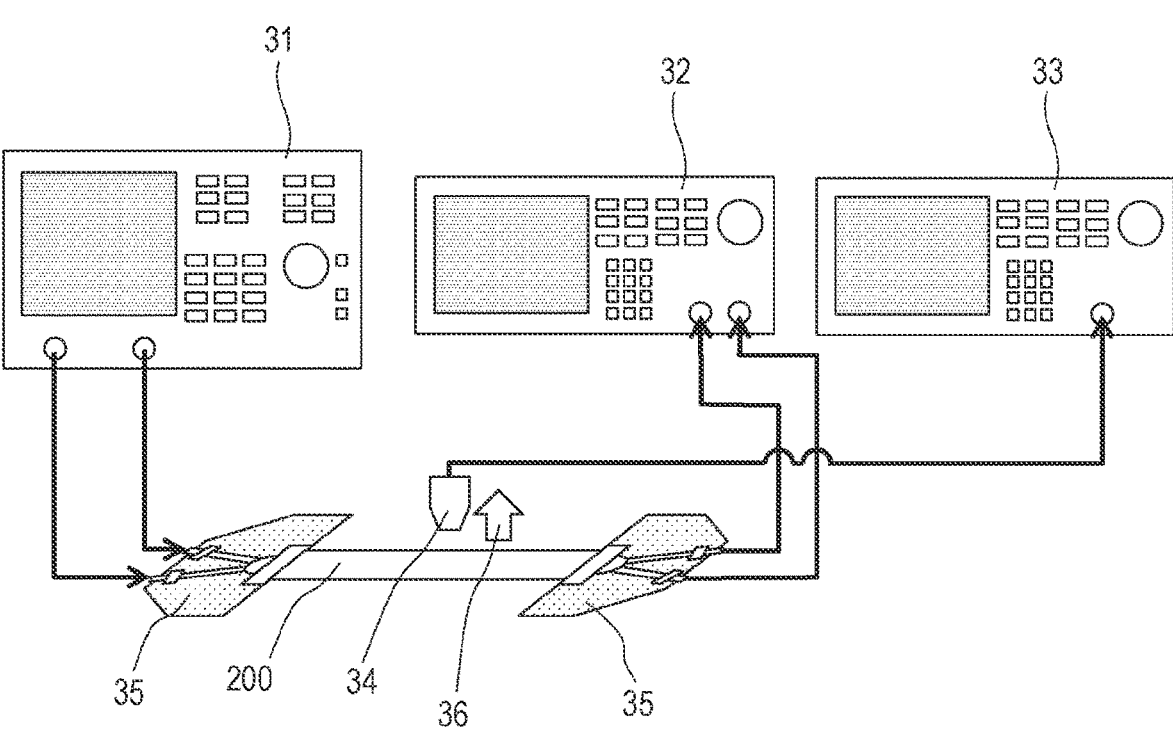
FIG. 5 is a schematic view of a system that was used to evaluate the radiation noise characteristics of wiring boards of Examples and wiring boards of Comparative Examples.

The radiation noise amount of the wiring board A and the wiring board B was evaluated by using a system having the configuration illustrated in FIG. 5. First, as a reference, a differential wiring substrate for measuring the radiation noise amount of a wiring board without the shield member 220 (see FIG. 1B) was prepared. Copper foil having a thickness of 12 µm was stacked, as a wiring layer, on one surface of a substrate of a polyimide film (Kapton 100H, made by Du Pont-Toray Co., Ltd.) having a thickness 25 µm. Subsequently, a differential transmission line having a line width of 140 µm, a line interval of 55 µm, and a total length of 120 mm was made by using an etching method.

Next, a polyimide film having a thickness of 12.5 µm and a coverlay having a thickness of 15 µm (CISV1215, made by Nikkan Industries Co., Ltd.) were affixed onto the wiring layer, thereby obtaining a differential wiring substrate without a ground layer for reference.

Next, this wiring board was connected to a connection substrate 35. By using a signal generator 31 (M8041A, made by Keysight Technologies, Inc.), a signal at a bit rate 10 Gbps having a PRBS23 data pattern was sent. Then, the waveform of a common mode voltage was observed by using an oscilloscope 32 (92504A, made by Agilent Technologies Inc.), and the input amplitude was adjusted so that the common mode voltage became 150 mV.

Next, the wiring board A or the wiring board B, which was to be measured, was connected to the connection substrate 35, and, by using the signal generator 31, a signal at a bit rate 10 Gbps having a PRBS23 data pattern was sent. Here, the signal was sent with an input amplitude adjusted by using a differential wiring substrate without the shield member 220 for reference. Radiation noise 36 in 10 GHz band generated from the wiring board 200 at that time was detected by using a near field probe 34 having a pen-like shape and a length of 110 mm (made by Electro-Metrics Corporation) and was measured by using a spectrum analyzer 33 (E4440A, made by Keysight Technologies, Inc.). The near field probe 34 was set at points at a height of 5 mm from the wiring board, and the radiation noise amount was scanned five times at each point. All points at 1 mm intervals in the region where the shield member 220 was formed was scanned by using the near field probe 34, and the average value of radiation noise amounts was calculated.

The difference between the amount of noise radiated from the wiring board for reference and the amount of noise radiated from the wiring board A and the wiring board B was evaluated as the blocking amount. A wiring board having a larger blocking amount had better shielding ability. The radiation noise measurement was performed in the 10 GHz frequency band in an atmosphere having a temperature of 25° C. and a relative humidity in the range of 23 to 50%.

Example 1

The electroconductive layer 221, which was an electromagnetic noise blocking layer, was formed on the insulating layer 251 of the wiring board body 210 (see FIG. 1B). The electroconductive layer 221 was formed by printing a silver paste made by Kyoto Elex Co., Ltd. (product name: DD-1630L-245) on the main surface 231 of the insulating layer 251 by using a screen printer (MT-320T, made by Micro-tec Co., Ltd.) under a condition such that the thickness of the electroconductive layer 221 fell in the range of 3 to 6 μm. The volume resistivity of the line 2211, the line 2212, and the line 2213, which were formed of the paste material, of Example 1 was 7E-6.

As illustrated in FIG. 2A, the electroconductive layer 221 of Example 1 had a mesh pattern formed of two groups of parallel lines that intersect each other, and the connection portion 2214 was disposed on the sending side of the transmission path in the signal line 22. The angle θ between the line 2213 and the direction in which the signal line 22 extended was an acute angle. Four lines 2213 were provided in each opening 2210, and the lengths of the lines 2213 were respectively 4.2 mm, 5.2 mm, 7.0 mm, and 16.8 mm.

The insulating layer 222 was formed on the electroconductive layer 221 (see FIG. 1B). The insulating layer 222 was formed from a polyamide-imide coating resin solution made by Toyobo Co. (product name: HR-16NN) by using a slit coater (SHOTMASTER 300Ω X, made by Musashi Engineering, Inc.). The thickness of the insulating layer 222 of Example 1 was 6 μm.

The result was that the high-speed transmission ability was 121 mV, and the radiation noise suppression amount was 10 dB in Example 1.

Example 2

In Example 2, the wiring board body 210 and the insulating layer 222 having the same configurations as those in Example 1 were used. In the electroconductive layer 221, the line 2211 and the line 2212 were formed by using the same materials and the same devices as those in Example 1. In Example 2, after the line 2211 and the line 2212 had been formed, the line 2213 was formed by using the same method as in Example 1 by using silver paste made by Kyoto Elex Co., Ltd. (product name: DD-1930L-133). The volume resistivity of the line 2211 and the line 2212 was 7E-5, and the volume resistivity of the line 2213 was 7E-6.

The result was that the high-speed transmission ability was 120 mV, and the radiation noise suppression amount was 10 dB in Example 2.

Example 3

In Example 3, the wiring board body 210 and the insulating layer 222 having the same configuration as those in Example 1 were used. In the electroconductive layer 221, the line 2211 and the line 2212 were formed by using the same materials and the same devices as those in Example 1. In the present Example, the line 2211 and the line 2212 were formed by using a silver paste made by Kyoto Elex Co., Ltd. (product name: DD-1930L-133). Subsequently, the line 2213 was formed by using the same method as in Example 1 from a silver paste made by Kyoto Elex Co., Ltd. (product name: DD-1630L-245).

The result was that the high-speed transmission ability was 121 mV, and the radiation noise suppression amount was 8 dB in Example 3.

Example 4

In Example 4, in contrast to Examples 1 to 3, the line 2213 had a spiral shape illustrated in FIG. 4. The length of the line 2213 was 4.2 mm. The other configurations were the same as those in Example 1.

The result was that the high-speed transmission ability was 128 mV, and the radiation noise suppression amount was 7 dB in Example 4.

Comparative Example 1

In Comparative Example 1, the same configurations as those in Example 1 were used, except that the connection portion 2214 was disposed on the receiving side of the transmission path in the signal line 22.

The result was that the high-speed transmission ability was 122 mV, and the radiation noise suppression amount was 3 dB in Comparative Example 1.

Comparative Example 2

In Comparative Example 2, the same configurations as those in Example 4 were used, except that the connection portion 2214 was disposed on the receiving side of the transmission path in the signal line 22.

The result was that the high-speed transmission ability was 125 mV, and the radiation noise suppression amount was 4 dB in Comparative Example 2.

Comparative Example 3

In Comparative Example 3, the same configurations as those in Example 1 were used, except that the line 2213 was not provided.

The result was that the high-speed transmission ability was 138 mV, and the radiation noise suppression amount was 1 dB in Comparative Example 3.

Evaluation Results

Table 1 shows the results of Examples 1 to 4 and Comparative Examples 1 to 3. In Examples 1 to 4 and Comparative Examples 1 to 3, the transmission ability was good. However, in Comparative Examples 1 to 3, a desirable radiation noise blocking effect could not be obtained, because the connection portion 2214 was disposed on the receiving side or because the line 2213 for suppressing radiation noise was not provided. In contrast, in Examples 1 to 4, good noise suppression could be obtained, because the connection portion 2214 was disposed on the sending side and the line 2213 was provided.

device, a communication device, a storage device, or a power supply. Each of the electronic components mounted on the wiring boards 110 and 120 is not limited to an active component and may be a passive component.

TABLE 1

| | Example 1 | Example 2 | Example 3 | Example 4 | Comparative Example 1 | Comparative Example 2 | Comparative Example 3 |
|---|---|---|---|---|---|---|---|
| Presence/Absence of Opening 2210 | present | present | present | present | present | present | present |
| Presence/Absence of Line 2213 | present | present | present | present | present | present | absent |
| Position of Connection Portion 2214 | sending side | sending side | sending side | sending side | receiving side | receiving side | — |
| Shape of Line 2213 | bent line shape | bent line shape | bent line shape | spiral shape | bent line shape | spiral shape | — |
| Volume Resistivity of Line 2211, Line 2212 ($\Omega \cdot$ cm) | 7E–6 | 7E–6 | 7E–5 | 7E–6 | 7E–6 | 7E–6 | 7E–6 |
| Volume Resistivity of Line 2213 ($\Omega \cdot$ cm) | 7E–6 | 7E–5 | 7E–6 | 7E–6 | 7E–6 | 7E–6 | — |
| High-Speed Transmission Ability (mV) | 121 | 120 | 121 | 128 | 122 | 125 | 138 |
| Radiation Noise Suppression Amount (dB) | 10 | 10 | 8 | 7 | 3 | 4 | 1 |

Third Embodiment

Figure 6:
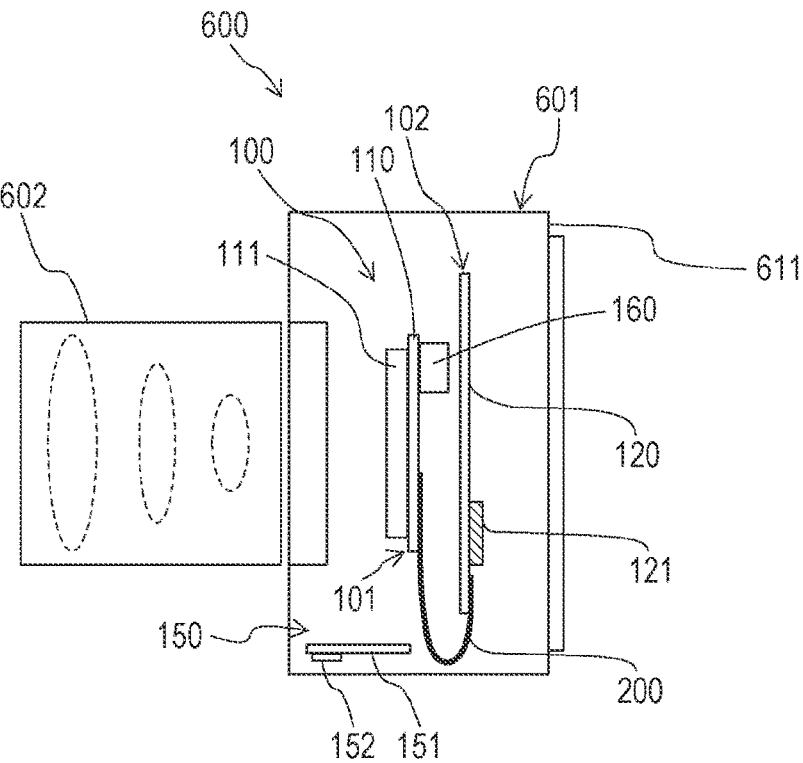
FIG. 6 illustrates a digital camera that is an imaging device as an example of an electronic apparatus according to an embodiment.

Next, referring to FIG. 6, a digital camera 600 that is an imaging device as an example of an electronic apparatus including either of the wiring boards 200 described in the first and second embodiments will be described.

The digital camera 600 is a lens-interchangeable digital camera, and includes a camera body 601. A lens unit (lens barrel) 602, including lenses, is attachable to and removable from the camera body 601. The camera body 601 includes a housing 611, the electronic unit 100, and a wireless communication unit 150. The electronic unit 100 and the wireless communication unit 150 are accommodated inside of the housing 611. The electronic unit 100 of an imaging device as in the present embodiment is an imaging unit.

The electronic unit 100 includes the circuit board 101, the circuit board 102, and the wiring board 200 that electrically connects the circuit board 101 and the circuit board 102. The circuit board 101 is an example of a first circuit board. The circuit board 102 is an example of a second circuit board. By using the wiring board 200 to connect the circuit board 101 and the circuit board 102, it is possible to make the weight of the wiring structure lighter than a coaxial cable. Here, as the wiring board 200, either of the wiring boards described above in the first and second embodiments is used.

The circuit board 101 includes the wiring board 110 and the semiconductor device 111 mounted on the wiring board 110. The circuit board 102 includes the wiring board 120 and the semiconductor device 121 mounted on the wiring board 120. The semiconductor device 111 and the semiconductor device 121 are examples of electronic components mounted on the wiring board 110 and 120. Each of the electronic components mounted the on the wiring boards 110 and 120 may be an imaging device, an arithmetic device, a display In the present embodiment, the semiconductor device 111 is an image sensor (imaging device). The image sensor is, for example, a complementary metal oxide semiconductor (CMOS) image sensor or a charge coupled device (CCD) image sensor. The image sensor has a function of converting light, which is incident thereon via a lens unit 602, into an electric signal. In the present embodiment, the semiconductor device 121 is a processor (arithmetic device) such as a digital signal processor or an image signal processor. The image signal processor has a function of: obtaining an electric signal, which represents image data, from the semiconductor device 111 that is an image sensor (imaging device); performing processing for correcting the obtained electric signal; and generating and outputting corrected image data. An article in which the circuit board 101 connected to the wiring board 200 includes an image sensor can be called an imaging module or an imaging unit. The imaging module is an example of an electronic module, and the imaging unit is an example of the electronic unit 100.

In the present embodiment, the electronic unit 100 includes a driving device 160 that moves the circuit board 101 (the wiring board 110 and the semiconductor device 111). The driving device 160 includes a motor that is an example of a driving source. The digital camera 600, which includes the electronic unit 100 including the driving device 160, can perform a camera shake compensation (antivibration) function by moving the semiconductor device 111 via the circuit board 101. The driving source of the driving device 160 is not limited to an electromagnetic motor, and may be a piezoelectric motor such as an ultrasonic motor, or an electrostatic motor. Flexibility is required for the wiring board 200, because the wiring board 200 is connected to the circuit board 101 that is moved as described above.

Instead of the electronic unit 100 including the wiring board 200 and the circuit boards 101 and 102, a unit including either of the circuit board 101 and the circuit board 102 and further including the driving device 160 and other articles can also be called an electronic unit.

In the present embodiment, the wiring board 200 is mounted in a bent state in the digital camera 600, and is disposed so that the electroconductive layer 221 side is the outer side of a curved surface. That is, the electroconductive layer 221 corresponds to the surface of the wiring board 200 on the housing 611 side.

The wireless communication unit 150 is a module that performs wireless communication in a GHz band. The wireless communication unit 150 includes a rigid wiring board that is an example of a wiring board 151 including an antenna (not shown) and a wireless communication IC 152 mounted on the wiring board 151. The antenna is provided in the same plane as the wireless communication IC 152, and is disposed at a position near the housing 611 so that the antenna can easily communicate with the outside. The wireless communication IC 152 may be capable of sending and/or receiving image data via the antenna by performing wireless communication with an external apparatus such as a PC or a wireless router. In the present embodiment, the wireless communication IC 152 can send and receive data via the antenna. To be specific, the wireless communication IC 152 modulates a digital signal acquired from the semiconductor device 121 and representing image data, and sends from the antenna the digital signal as an electromagnetic wave having a communication frequency compliant with a wireless standard. Moreover, the wireless communication IC 152 demodulates an electromagnetic wave received by the antenna into a digital signal representing image data. The wireless communication IC 152 performs wireless communication with an external apparatus in accordance with a standard such as Wi-Fi (registered trademark) or Bluetooth (registered trademark). By using the electroconductive layer 221, which is provided in the wiring board 200 of the electronic unit 100 as an imaging unit, as an electromagnetic shield, it is possible to suppress an electromagnetic wave emitted from the wireless communication unit 150 from generating noise in the electronic unit 100. It is also possible to use the wiring board 200 to connect the wiring board 151 to another wiring board.

The embodiments described above may be changed as appropriate within the scope of the technical idea.

For example, in the first and second embodiments, the first portion of the electroconductive layer, having a plurality of openings, has a grid shape composed of a plurality of linear electroconductive portions (the lines 2211) that are provided parallel to each other and a plurality of linear electroconductive portions (the lines 2212) that intersect these and that are provided parallel to each other. However, this is not a limitation. It is sufficient that the first portion of the electroconductive layer have a plurality of openings that are arranged two-dimensionally in a surface of the layer. The shape of each opening is not limited to a rhombus as in the embodiments described above, and may be a polygon such as a quadrangle or hexagon, or an ellipse. It is desirable that the first portion of the electroconductive layer other than the openings have a linear shape with a uniform width. However, this is not a limitation.

In the first and second embodiments, the second portion is provided in all openings provided in the first portion of the electroconductive layer. However, this is not a limitation. It is sufficient that the second portion of the electroconductive layer be formed in at least one of the plurality of openings provided in the first portion.

Further, the shape of the second portion of the electroconductive layer is not limited to a bent line shape in Example 1 nor a spiral shape in Example 2. Any appropriate shape can be used as long as the shape is a linear shape such that one end thereof is connected to the first portion of the electroconductive layer and the other end thereof is an open end and the extension direction of at least a part of the second portion intersects the extension direction of the signal line at an angle that is not 0° nor 90°. Second portions having two or more different shapes may be formed in a plurality of openings of the first portion of the electroconductive layer.

Further, a plurality of embodiments may be combined. Some of the items in at least one of the embodiments may be removed or replaced.

A new item may be added to at least one of the embodiments. The disclosed contents of the present specification include not only matters that are explicitly described in the present specification but also all matters that can be grasped from the present specification and the drawings attached the present specification.

The disclosed contents of the present specification include the complement of each individual concept described in the present specification. That is, when there is a description in the present specification such that "A is greater than B.", even if a description such that "A is not greater than B." is omitted, it can be said that the present specification discloses that "A is not greater than B.". This is because, when it is described that "A is greater than B.", it is presupposed that a case where "A is not greater than B." is taken into consideration.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-169813, filed Oct. 24, 2022, which is hereby incorporated by reference herein in its entirety.

What is claimed is:

1. A flexible wiring board comprising:
a signal line that transmits a signal; and
an electroconductive layer that is disposed to face the signal line,
wherein the electroconductive layer includes
a first portion in which a plurality of openings are provided, and
a linear second portion that is formed in at least one of the plurality of openings, that has, at one end thereof, a connection portion connected to the first portion, and whose other end is an open end,
wherein the connection portion is disposed in the linear second portion on a sending side in a transmission direction of a signal through the signal line, and
wherein an angle between a direction along the transmission direction of the signal and an extension direction of the linear second portion from the connection portion toward the open end is an acute angle or an obtuse angle,
wherein the linear second portion has a bent line shape.
2. The flexible wiring board according to claim 1, wherein an angle between an extension direction of the signal line along the transmission direction of the signal and the extension direction of the linear second portion from the connection portion toward the open end is an acute angle.

3. The flexible wiring board according to claim 1, wherein the first portion has a grid shape composed of a plurality of linear electroconductive portions that are provided parallel to each other and a plurality of other linear electroconductive portions that intersect the plurality of linear electroconductive portions and that are provided parallel to each other, and extension directions of the electroconductive portions and the other electroconductive portions differ from an extension direction of the signal line.

4. The flexible wiring board according to claim 3, wherein a line width of the linear second portion is greater than at least one of a line width of the electroconductive portions and a line width of the other electroconductive portions of the first portion.

5. A manufacturing method of manufacturing the flexible wiring board according to claim 1, comprising forming the electroconductive layer by screen printing.

6. A flexible wiring board comprising:
a signal line that transmits a signal; and
an electroconductive layer that is disposed to face the signal line,
wherein the electroconductive layer includes
a first portion in which a plurality of openings are provided, and
a linear second portion that is formed in at least one of the plurality of openings, that has, at one end thereof, a connection portion connected to the first portion, and whose other end is an open end,
wherein the connection portion is disposed in the linear second portion on a sending side in a transmission direction of a signal through the signal line, and
wherein an angle between a direction along the transmission direction of the signal and an extension direction of the linear second portion from the connection portion toward the open end is an acute angle or an obtuse angle,
wherein the linear second portion includes a plurality of second portions that are disposed in at least one of the plurality of openings.

7. The flexible wiring board according to claim 6, wherein a distance between one of the plurality of second portions and another of the plurality of second portions adjacent to the one of the plurality of second portions is 20 μm or greater.

8. The flexible wiring board according to claim 6, wherein lengths of the plurality of second portions differ from each other.

9. The flexible wiring board according to claim 8, wherein the linear second portion includes three or more second portions, and, between a first second portion having a shortest length among the three or more second portions and a second second portion having a longest length among the three or more second portions, a third second portion having a length that is longer than the length of the first second portion and shorter than the length of the second second portion is provided.

10. An electronic module comprising:
a flexible wiring board;
a rigid wiring board to which one end portion of the flexible wiring board is connected; and an electronic component mounted on the rigid wiring board,
wherein the flexible wiring board comprising:
a signal line that transmits a signal; and
an electroconductive layer that is disposed to face the signal line,
wherein the electroconductive layer includes
a first portion in which a plurality of openings are provided, and
a linear second portion that is formed in at least one of the plurality of openings, that has, at one end thereof, a connection portion connected to the first portion, and whose other end is an open end,
wherein the connection portion is disposed in the linear second portion on a sending side in a transmission direction of a signal through the signal line, and
wherein an angle between a direction along the transmission direction of the signal and an extension direction of the linear second portion from the connection portion toward the open end is an acute angle or an obtuse angle.

11. The electronic module according to claim 10, wherein the linear second portion has a spiral shape.

12. The electronic module according to claim 10, wherein the linear second portion includes one or more second portions provided in each of the plurality of openings.

13. The electronic module according to claim 10, wherein a length of the linear second portion is 17 mm or less.

14. The electronic module according to claim 10, wherein a line width of the linear second portion is 50 μm or greater and 200 μm or less.

15. The electronic module according to claim 10, wherein an opening ratio of the electroconductive layer is 40% or greater and 95% or less.

16. The electronic module according to claim 10, wherein the linear second portion has a bent line shape.

17. The electronic module according to claim 10, wherein the electronic component includes an image sensor.

18. An electronic unit comprising:
the electronic module according to claim 17; and
a driving device that moves the rigid wiring board.

19. An electronic apparatus comprising:
the electronic module according to claim 17; and
a circuit board to which another end portion, which is different from the one end portion, of the flexible wiring board is connected,
wherein a processor that processes a signal that is output from the electronic component is mounted on the circuit board.

20. An electronic apparatus comprising:
the electronic module according to claim 17; and
a housing that accommodates the electronic module,
wherein the flexible wiring board is accommodated in the housing in a state in which the flexible wiring board is bent, and
wherein the electroconductive layer is provided on an outer surface that is one of bent surfaces of the flexible wiring board.

* * * * *